United States Patent
Tao et al.

(10) Patent No.: US 7,907,447 B2
(45) Date of Patent: Mar. 15, 2011

(54) SECURE NON-VOLATILE MEMORY DEVICE AND METHOD OF PROTECTING DATA THEREIN

(75) Inventors: Guoqiao Tao, Nijmegen (NL); Steven V. E. S. Van Dijk, Eindhoven (NL)

(73) Assignee: NXP B.V., Eindhoven (NL)

( * ) Notice: Subject to any disclaimer, the term of this patent is extended or adjusted under 35 U.S.C. 154(b) by 85 days.

(21) Appl. No.: 12/443,528

(22) PCT Filed: Sep. 27, 2007

(86) PCT No.: PCT/IB2007/053923
§ 371 (c)(1),
(2), (4) Date: Mar. 30, 2009

(87) PCT Pub. No.: WO2008/038243
PCT Pub. Date: Apr. 3, 2008

(65) Prior Publication Data
US 2010/0002511 A1   Jan. 7, 2010

(30) Foreign Application Priority Data
Sep. 29, 2006   (EP) ..................... 06121567

(51) Int. Cl.
*G11C 11/34*   (2006.01)
(52) U.S. Cl. ............... 365/185.11; 365/185.24
(58) Field of Classification Search ............. 365/185.11, 365/185.24
See application file for complete search history.

(56) References Cited

U.S. PATENT DOCUMENTS

| 5,553,016 | A | 9/1996 | Takebuchi |
| 2002/0085423 | A1 | 7/2002 | Tedrow et al. |
| 2003/0161184 | A1 | 8/2003 | Lee et al. |
| 2005/0068802 | A1* | 3/2005 | Tanaka .................... 365/145 |

FOREIGN PATENT DOCUMENTS

| EP | 0 224 206 A2 | 6/1987 |
| WO | 2004070730 A | 8/2004 |

OTHER PUBLICATIONS

C. De Nardi, et al; "Oxide Charge Measurements in EEPROM Devices"; Microelectronis Reliability, vol. 45; 2005; pp. 1514-1519.

* cited by examiner

*Primary Examiner* — Michael T Tran (57) ABSTRACT

The invention relates to a non-volatile memory device comprising: an input for providing external data (D1) to be stored on the non-volatile memory device; and a first non-volatile memory block (100) and a second non-volatile memory block (200), the first non-volatile memory block (100) and the second non-volatile memory block (200) being provided on a single die (10), wherein the first non-volatile memory block (100) and second non-volatile memory block (200) are of a different type such that the first non-volatile memory block (100) and the second non-volatile memory block (200) require incompatible external attack techniques in order to retrieve data there from, the external data (D1) being stored in a distributed way (D1', D1") into both the first non-volatile memory block (100) and the second non-volatile memory block (200). The invention further relates to method of protecting data in a non-volatile memory device.

9 Claims, 6 Drawing Sheets

SECURE NON-VOLATILE MEMORY DEVICE AND METHOD OF PROTECTING DATA THEREIN

FIELD OF THE INVENTION

The invention relates to a non-volatile memory device. The invention further relates to a method of protecting data in a non-volatile memory device.

BACKGROUND OF THE INVENTION

Non-volatile memory devices (ROM, PROM, EPROM, EEPROM, etc) are widely known. Also they have been widely used in applications where the data needs to be protected, like in home applications, mobile applications, and set-top boxes (pay TV, satellite TV, etc). In the last decades various methods of attacking data on non-volatile memory devices have been developed:
  front-side de-processing combined with optical imaging
  back-side de-processing combined with voltage contrast imaging
  microprobing
  UV treatment
  Software attack
  FIB (cut and sense),
  etc.

In general non-volatile memories like floating gate-based memories and ONO-based memories have been regarded as very secure to these attacks. However, recently, in C. De Nardi et al., *Microelectronics Reliability*, Vol. 45 (2005), p 1514-1519, a method has been published which enables retrieval of data from EEPROM memory devices. This publication discloses a method to measure "on site" programmed charges in EEPROM devices. Electrical AFM based techniques (Electric Force Microscopy (EFM) and Scanning Kelvin Probe Microscopy (SKPM) are used to probe directly floating gate potentials. Both preparation and probing methods are discussed. Sample preparation to access floating gate/oxide interfaces at a few nanometers from the back-side without discharging the data reveals to be the key point, more than the probing technique itself. This method will also be referred to as back-side voltage contrast imaging.

So, a drawback of the known non-volatile memory devices is that data stored thereon may no longer be secure enough to external attacks.

SUMMARY OF THE INVENTION

It is an object of the invention to provide a non-volatile memory device, which is more secure to external attacks. It is a further object of the invention to provide a method of protecting data in a non-volatile memory device against external attacks.

The invention is defined by the independent claims. The dependent claims define advantageous embodiments.

The object of the invention is realized in that a non-volatile memory device is provided, which comprises:
  an input for providing external data to be stored on the non-volatile memory device; and
  a first non-volatile memory block and a second non-volatile memory block, the first non-volatile memory block and the second non-volatile memory block being provided on a single die, wherein the first non-volatile memory block and second non-volatile memory block are of a different type such that the first non-volatile memory block and the second non-volatile memory block require incompatible external attack techniques in order to retrieve data there from, the external data being stored in a distributed way into both the first non-volatile memory block and the second non-volatile memory block.

An essential element of the invention is that the non-volatile memory device comprises at least two memory blocks on which the external data is stored. As a result of this measure, in order to be able retrieve the external data, which was originally stored on the memory device, it is essential that data is retrieved from both the first non-volatile memory block and the second non-volatile memory block.

A non-volatile memory cell typically comprises a transistor having a charge storage region (floating gate, charge trap layer in an oxide-nitride-oxide device, etc). Each external attack technique may comprise a deprocessing (reverse engineering) step in order to be able to access the charge storage regions of the memory blocks and in order to determine how the memory cells are connected (either from the front-side or from the back-side) and an investigation/probing/observation step for determining the charge on the charge storage regions. An essential feature of the invention is that the first non-volatile memory block and the second non-volatile memory block require different incompatible external attack techniques. Because of the above-mentioned features of the non-volatile device according to the invention it is very hard to retrieve the data originally stored on the non-volatile memory device.

In an advantageous embodiment of the non-volatile memory device according to the invention a first part of a word of the external data has been stored into the first non-volatile memory block, and a second part of the word of the external data has been stored into the second non-volatile memory block. In an alternative advantageous embodiment of the non-volatile memory device according to the invention a first word of the external data has been stored into the first non-volatile memory block, and a second word of the external data has been stored into the second non-volatile memory block. Both embodiments ensure that both the data from the first non-volatile memory block as well as from the second non-volatile memory block needs to be known in order to obtain the data originally stored on the non-volatile memory device.

In one specific embodiment of the non-volatile memory device according to the invention the first non-volatile memory block and the second non-volatile memory block are layout-wise interlaced. Interlacing of the first non-volatile memory block and the second non-volatile memory blocks makes reverse-engineering of both blocks on the same die even more difficult.

In another embodiment of the non-volatile memory device according to the invention the first non-volatile memory block is a poly fuse memory and the second non-volatile memory block is a floating gate memory. This combination of memory types on a single die provides a very good resistance against external-attacks, because a poly fuse memory needs to be reverse-engineered from the front-side of the device and a floating gate memory needs to be reverse-engineered from the back-side in order to access the floating gates. It is important to note that during the reverse-engineering steps material is removed from the front-side and the back-side respectively, rendering it almost impossible to reverse-engineer both memory blocks on the same die at the same time.

Preferably, the poly fuse memory uses physically the same poly layer as the floating gate memory, which makes it even more difficult to reverse-engineer both memory blocks at the same time. When a hacker tries to obtain data from the first memory block, being a poly fuse memory, by means of optical imaging the retrieval of the data on the second memory block, being a floating-gate memory, is blocked. This is due to the fact that optical imaging of the poly fuse memory requires front-side de-layering of a die, while back-side voltage contrast imaging of the non-volatile memory requires back-side de-layering of a die. And it is at least extremely difficult and maybe even impossible to de-layer a die from both sides. Similarly, when a hacker tries to retrieve the data from the floating-gate memory by back-side de-layering, it would make it virtually impossible to retrieve memory information later on from the poly fuse memory from the same die.

In further improved embodiment of the non-volatile memory device according to the invention bit lines of at least one of the first non-volatile memory block and the second non-volatile memory block have been scrambled. Scrambling the bit lines means that the bit-lines are laid out in some sort of "spaghetti-like" way. Reverse-engineering by optical inspection of the interconnections is thus made very hard by this measure.

In one particular embodiment of the non-volatile memory device according to the invention the non-volatile memory further comprises:

a third non-volatile memory block, the third non-volatile memory block being provided on the same single die as the first non-volatile memory block and the second non-volatile memory block, wherein the third non-volatile memory block is of a different type than the first non-volatile memory block and second non-volatile memory block such that the first non-volatile memory block, the second non-volatile memory block, and the third non-volatile memory block require incompatible external attack techniques in order to retrieve data there from, the external data being stored in a distributed way into the first non-volatile memory block, the second non-volatile memory block, and the third non-volatile memory block. Providing more memory blocks and distributing external data over more memory blocks increases the number of reverse engineering parameters to be determined by the hacker and thus makes external attacking of the device much more difficult.

The invention also relates to a method of protecting data in a non-volatile memory device, the method comprising steps of:

providing external data to be stored on the non-volatile memory device, the non-volatile memory device having a first non-volatile memory block and a second non-volatile memory block, the first non-volatile memory block and the second non-volatile memory block being provided on a single die, wherein the first non-volatile memory block and second non-volatile memory block are of a different type such that the first non-volatile memory block and the second non-volatile memory block require incompatible external attack techniques in order to retrieve data there from;

storing the external data in a distributed way into both the first non-volatile memory block and the second non-volatile memory block.

The method according to the invention provides a convenient way of protecting data in a non-volatile memory device.

BRIEF DESCRIPTION OF THE DRAWINGS

Any of the additional features can be combined together and combined with any of the aspects. Other advantages will be apparent to those skilled in the art. Numerous variations and modifications can be made without departing from the scope of the claims of the present invention. Therefore, it should be clearly understood that the present description is illustrative only and is not intended to limit the scope of the present invention.

How the present invention may be put into effect will now be described by way of example with reference to the appended drawings, in which.

DETAILED DESCRIPTION

Figure 1:
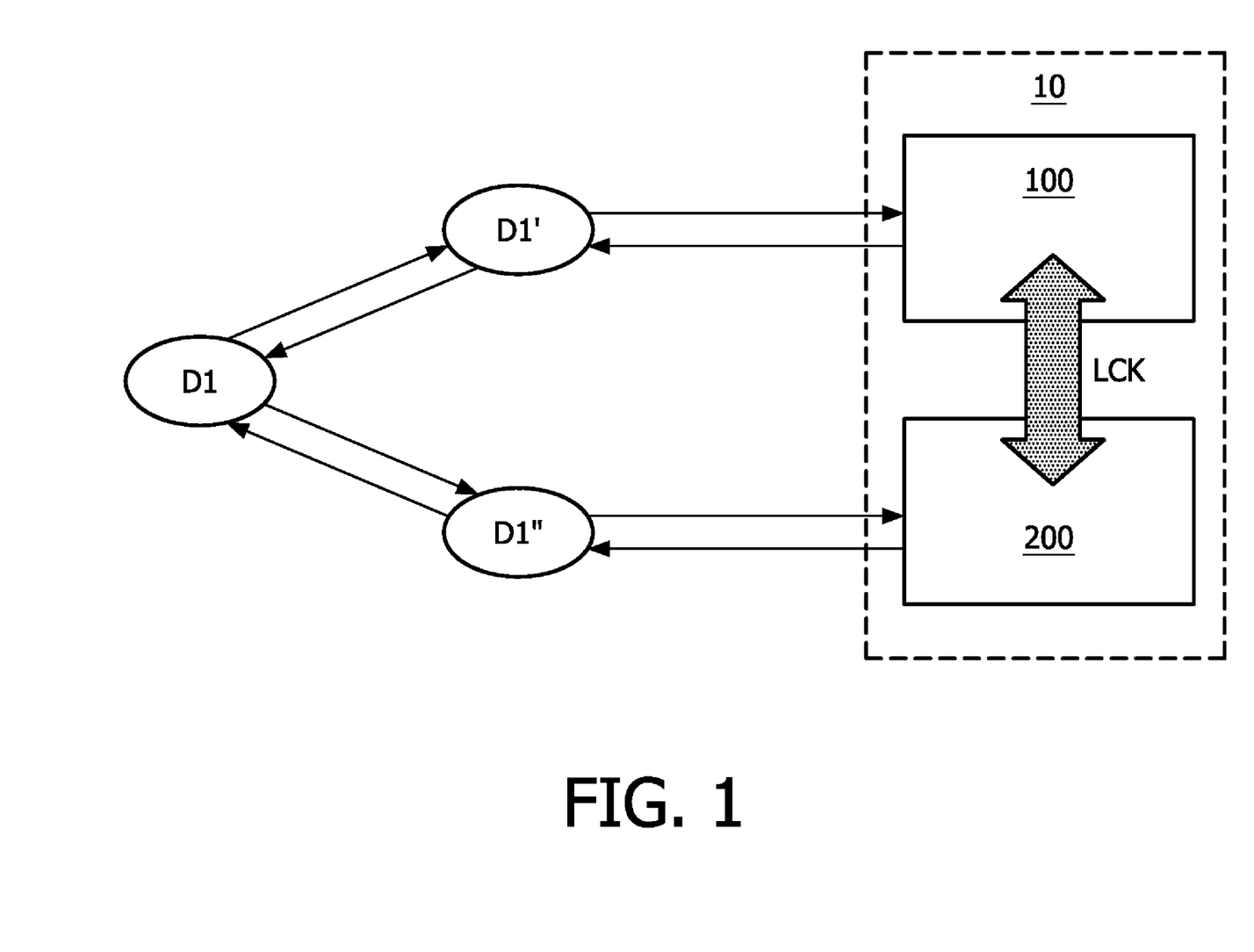
FIG. 1 illustrates a first embodiment of the non-volatile memory device according to the invention.

In FIG. 1 a non-volatile memory device according to a first embodiment of the invention is schematically illustrated. In this embodiment external data D is provided via an input (not shown) to the non-volatile memory device. The non-volatile memory device comprises a first non-volatile memory block 100 and a second non-volatile memory block 200, the first non-volatile memory block 100 and the second non-volatile memory block 200 being of a different type such that the they require incompatible external attack techniques in order to retrieve data there from.

The external data D1 is stored in a distributed way in both the first non-volatile memory block 100 and the second non-volatile memory block 200, a first part D1' being stored on the first non-volatile memory block 100 and a second part D1" being stored on the second non-volatile memory block 200. The first non-volatile memory block 100 and the second non-volatile memory block 200 are located on the same die 10, which is an essential feature of the invention. The required external attack techniques for both non-volatile memory blocks 100, 200 are incompatible, which feature provides a so-called interlock LCK between both non-volatile memory blocks 100, 200. It is therefore very difficult to retrieve data from both the first non-volatile memory block 100 and the second-non-volatile memory block 200 at the same time.

Figure 2:
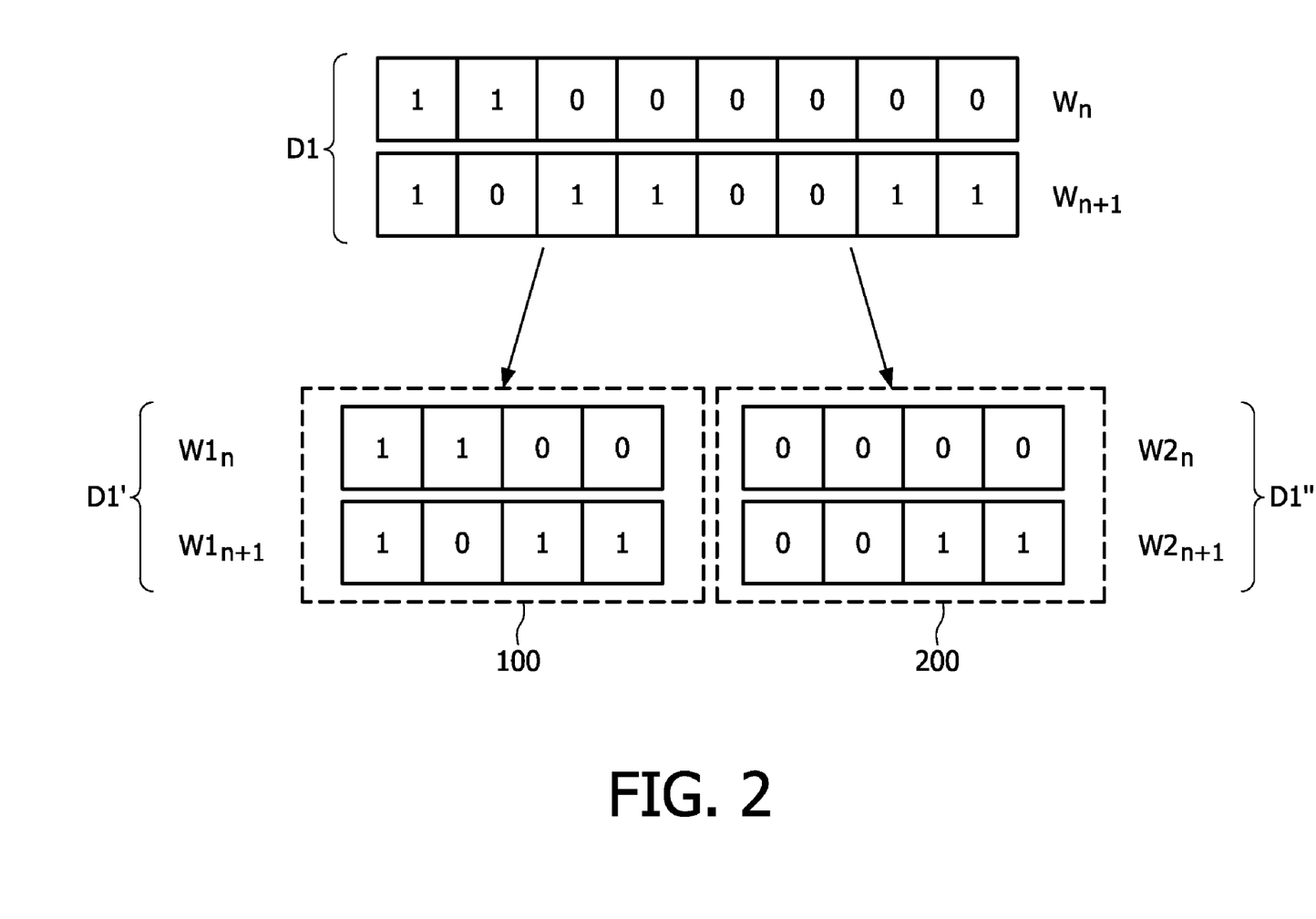
FIG. 2 illustrates a first way of distributing data over two memory blocks.

FIG. 2 illustrates a first way of distributing external data D1 over two memory blocks 100, 200. In this approach words $W_n$, $W_{n+1}$ from the external data D1 are split up in two parts D1', D1". A first part $W1_n$, $W1_{n+1}$ of the original words $W_n$, $W_{n+1}$ are stored into the first non-volatile memory block 100. A second part $W2_n$, $W2_{n+1}$ of the original words $W_n$, $W_{n+1}$ are stored into the second non-volatile memory block 200. In this example the original words comprises eight bits, however in a real design any number of bits may be possible. Also, in this example the original words are equally distributed over the two memory blocks 100, 200, meaning four bits in each memory. In a real design also other distributions are possible, e.g. six bits in the first memory block 100 and two bits in the second memory block 200, or any other distribution ratio.

Figure 3:
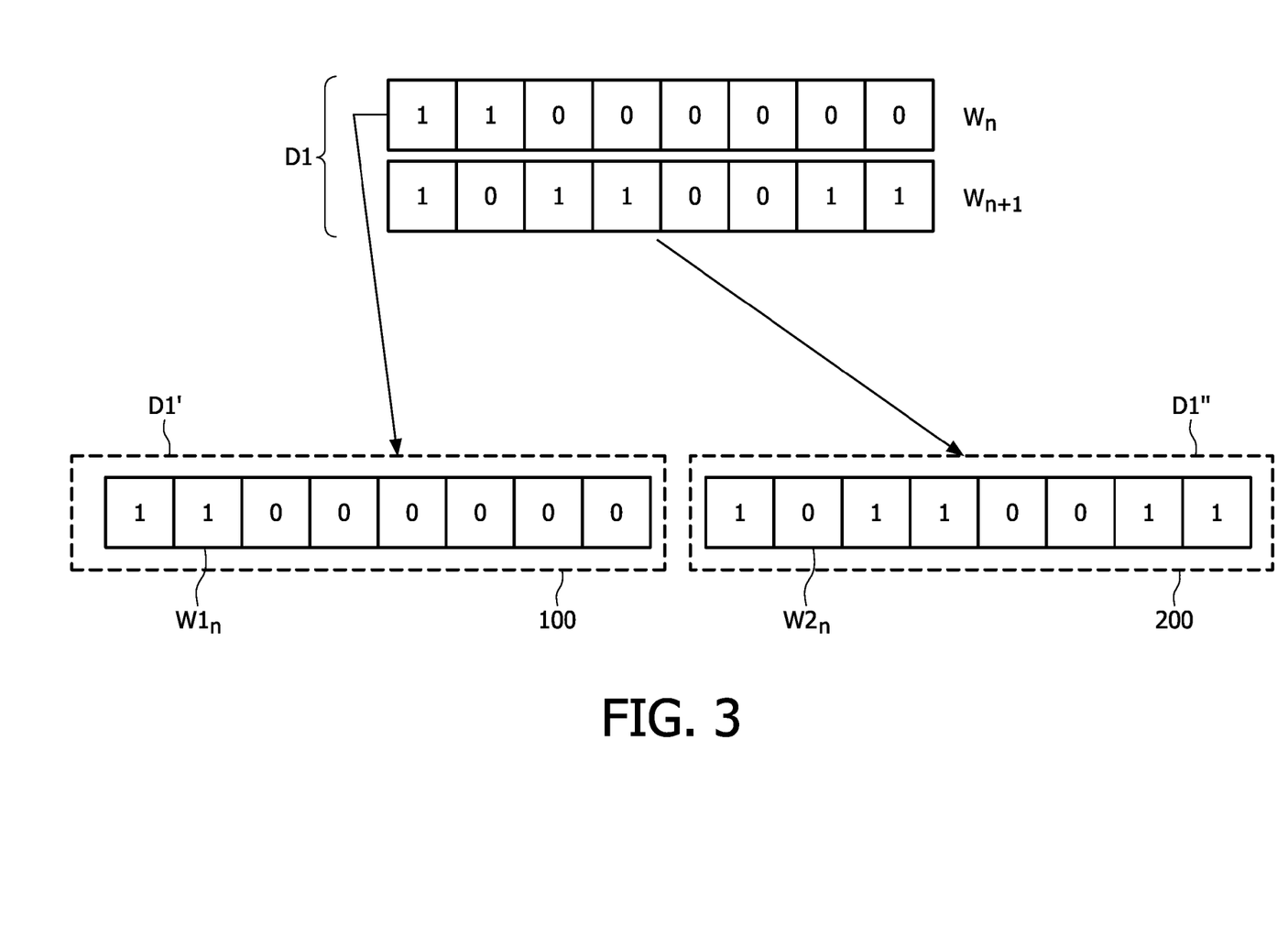
FIG. 3 illustrates a second way of distributing data over two memory blocks.

FIG. 3 illustrates a second way of distributing external data D1 over two memory blocks 100, 200. In this approach words $W_n$, $W_{n+1}$ from the external data D1 are not split up. Instead, the original words $W_n$, $W_{n+1}$ are stored in an alternating way into the first non-volatile memory block 100 and second non-volatile memory block 200 respectively. Original word $W_n$ is stored (as a word $W1_n$) in the first non-volatile memory block 100 and original word $W_{n+1}$ is stored (as a word $W2_n$) in the second non-volatile memory block 200. In this example the original words comprises eight bits, however in a real design any number of bits may be possible. Also, in this example the original words are equally distributed over the two memory blocks 100, 200, meaning an equal number of words in each memory. In a real design also other distributions are possible, e.g. a ratio of three words in the first memory block 100 versus one word in the second memory block 200, or any other distribution ratio.

Figure 4:
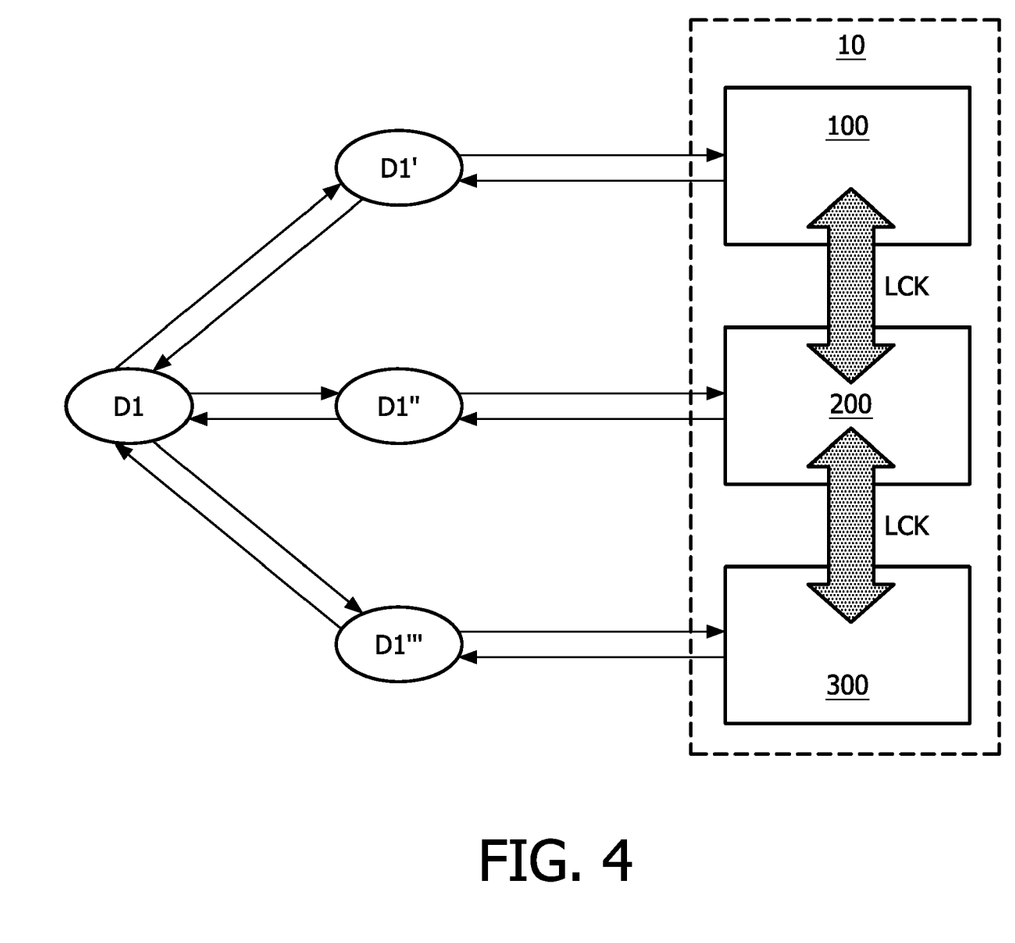
FIG. 4 illustrates a second embodiment of the non-volatile memory device according to the invention.

In FIG. 4 the non-volatile memory device according to a second embodiment of the invention is schematically illustrated. This embodiment of the non-volatile memory device according to the invention differs from the first embodiment in that the non-volatile memory device further comprises a third non-volatile memory block 300. The external data D1 now comprises a first part D1' being stored on the first non-volatile memory block 100, a second part D1" being stored on the second non-volatile memory block 200, and a third part D1'" being stored on the third non-volatile memory block 300. Spreading the external data D1 over multiple non-volatile memory blocks 100, 200, 300 provides a stronger interlock LCK and thus an additional security.

In the above embodiments a word may comprise 16, 32, 64, 128 bits in some examples. However, in principle, in all embodiments, a word can be of any length.

It is important to note that the external data may be encrypted data. This measure counteracts attack techniques like IC pin probing when the non-volatile memory device is placed in its application.

In a concrete example of the first embodiment of the non-volatile memory device according to the invention, the product concerns a single chip secure "product X" manufactured in a 90 nm technology. The technology features salicided polyfuses to be used as non-volatile memory. In "product X" this memory type is used for the first non-volatile memory block 100. The technology also features floating-gate memory as non-volatile memory. In "product X" this memory type is used for the second non-volatile memory block. The physical layer of the floating gates in the second non-volatile memory block 200 have been manufactured in the same physical layer as the salicided polyfuses in the first non-volatile memory block 100. This ensures a firm interlock LCK between the first and second non-volatile memories. When attacking the content of memory the polyfuse memory block 100, the content of the other floating memory block 200 is destroyed, and vice versa. In "product X", the first non-volatile memory block 100 contains part of a DieID code and the second non-volatile memory block 200 contains the other part. "Product X" could further comprise a provider ID, which may be from companies like UPC or KPN, wherein the provider ID is distributed over both the first 100 and second non-volatile memory block 200. Furthermore, a customer ID is provided on both the first 100 and the second non-volatile memory block 200. Sometimes a public key is required which can also be distributed over the first 100 and second non-volatile memory block 200. Sometimes this public key is temporary.

Figure 5:
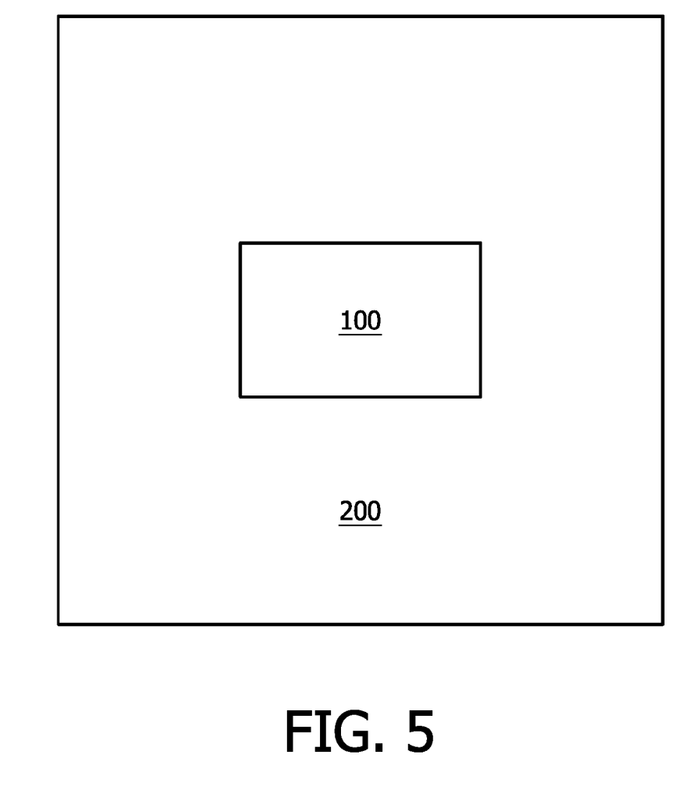
FIGS. 5 to 8 illustrate four different ways of interlacing memory blocks.
Figure 6:
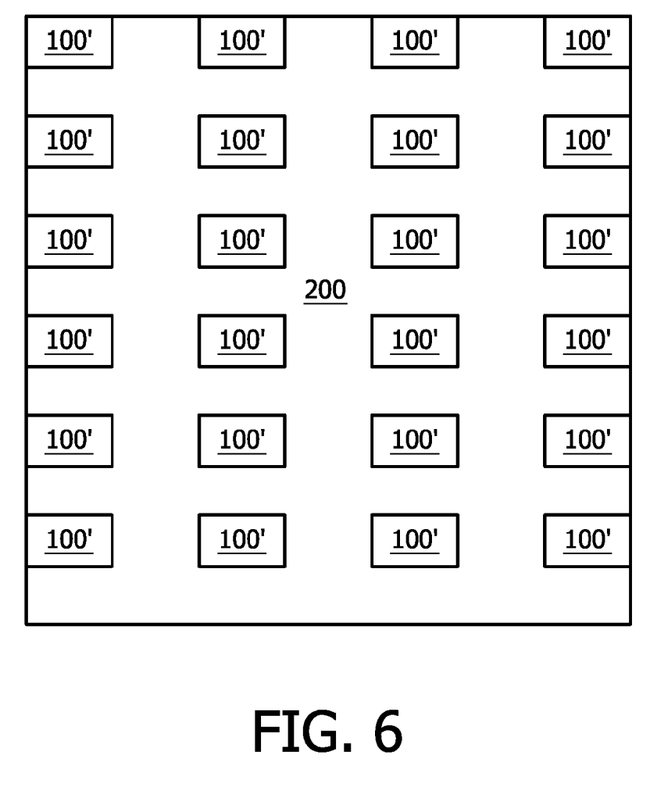
Figure 7:
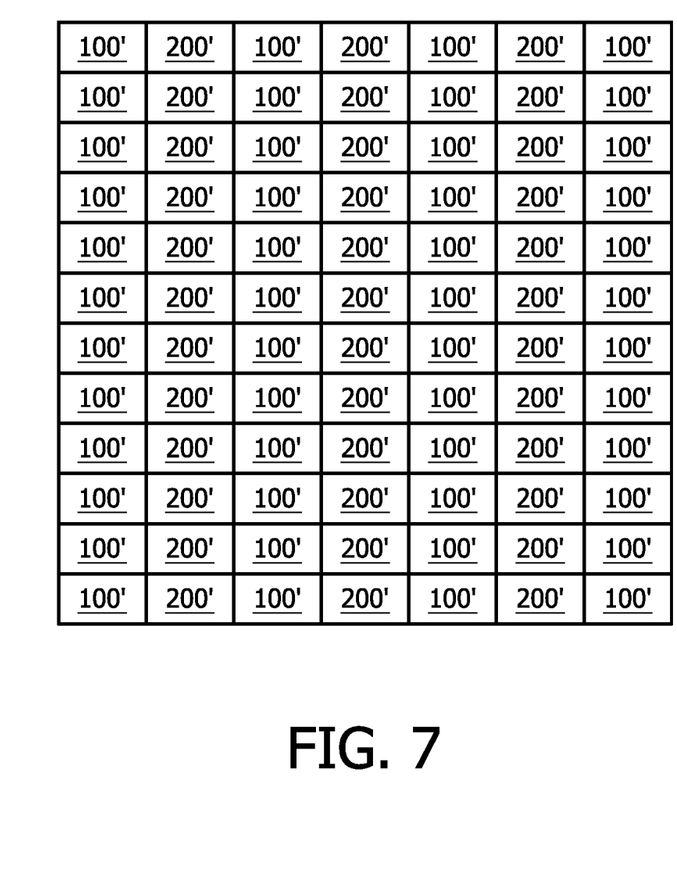
Figure 8:
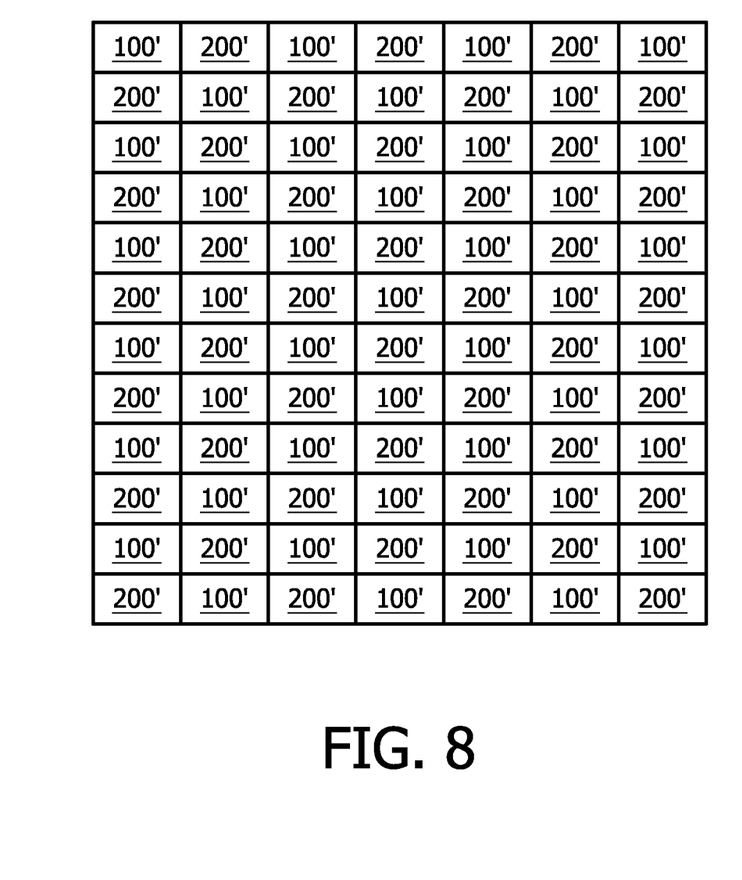

Another way of further improving the protection of the data on the non-volatile memory device is to interlace the memory blocks layout-wise. FIGS. 5 to 8 illustrate different approaches of interlacing two memory blocks. FIG. 5 illustrates a first non-volatile memory block 100 and a second non-volatile memory block 200, wherein the first non-volatile memory block 100 has been laid out inside the second non-volatile memory block 200. FIG. 6 illustrates another approach wherein memory cells 100' of the first non-volatile memory block 100 have been scattered or distributed over the layout of the second non-volatile memory block 200. FIG. 7 illustrates a third approach wherein memory cells 100' of the first non-volatile memory block 100 and memory cells 200' of the second non-volatile memory block 200 have been arranged in columns in an alternating way. Such an approach is interesting when the memory blocks 100, 200 are of comparable size. FIG. 8 illustrates a fourth approach wherein memory cells 100' of the first non-volatile memory block 100 and memory cells 200' of the second non-volatile memory block 200 have been arranged in an alternating way in both the column as well as the row direction. This approach is expected to provide the best interlock. However, for such an approach is most effective in case memory cells 100', 200' of the first 100 and second non-volatile memory blocks 200 are of comparable size.

An alternative way of further improving the protection of the data on the non-volatile memory device is to implement bit-line scrambling. Bitline scrambling is a kind of local "encryption" such that a logical bit and a physical bit are scrambled. One example is to make use of the multi-layered wiring in the technology through a "spaghetti-like" way so that the bit-line address for every byte (or word) columns are totally different from other bytes/words. In this way, the logic bits are scrambled physically and become very difficult to trace. For example, a 3 bits shifted byte would become Bit 3, Bit 4, Bit 5, Bit 6, Bit 7, Bit 0, Bit 1, Bit 2 (instead of Bit 0, . . . 7), and a mirrored byte would have bit sequence of Bit 7, Bit 6, Bit 5, Bit 4, Bit 3, Bit 2, Bit 1, Bit 0. In a real implementation, the scrambling is a combination of shifting, mirroring, swapping, etc. Bit-line scrambling makes reverse engineering by means of optical inspection very difficult. Bit-line scrambling can be combined with memory interlacing.

The invention thus provides a non-volatile memory device, which is more secure against external attack techniques. An important aspect of the invention lies in the interlocking of two or more memory blocks. The person skilled in the art knows the non-volatile memory technology used in the embodiments. The person skilled in the art also knows about non-volatile memory operation and integration. It is the insight of the inventors that a clever combination and integration of more than one memory on a single die provides a good interlock of the data and therefore a good security against external attacks. The invention may be used in various applications like: identification applications, home applications, mobile applications, and set-top boxes (pay TV, satellite TV, etc).

The invention also provides a method of protecting data in a non-volatile memory device, the method comprising steps of:
providing external data to be stored on the non-volatile memory device, the non-volatile memory device having a first non-volatile memory block and a second non-volatile memory block, the first non-volatile memory block and the second non-volatile memory block being provided on a single die, wherein the first non-volatile memory block and second non-volatile memory block are of a different type such that the first non-volatile memory block and the second non-volatile memory block require incompatible external attack techniques in order to retrieve data there from;
storing the external data in a distributed way into both the first non-volatile memory block and the second non-volatile memory block.

The advantages and improvements of this method follow those of the memory device described above.

The present invention has been described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Whenever the words "column" and "row" are used, they can be exchanged as well without departing from the scope of the invention.

The invention claimed is:

1. A non-volatile memory device comprising:
   an input for providing external data to be stored on the non-volatile memory device; and
   a first non-volatile memory block and a second non-volatile memory block, the first non-volatile memory block and the second non-volatile memory block being provided on a single die, wherein the first non-volatile memory block and second non-volatile memory block are of a different type such that the first non-volatile memory block and the second non-volatile memory block require incompatible external attack techniques in order to retrieve data therefrom, the external data being stored in a distributed way into both the first non-volatile memory block and the second non-volatile memory block and retrieved from both in order to discern a set of data representing the external data distributed therein.

2. A non-volatile memory device comprising:
   an input for providing external data to be stored on the non-volatile memory device; and
   a first non-volatile memory block and a second non-volatile memory block, the first non-volatile memory block and the second non-volatile memory block being provided on a single die, wherein the first non-volatile memory block and second non-volatile memory block are of a different type such that the first non-volatile memory block and the second non-volatile memory block require incompatible external attack techniques in order to retrieve data there from, the external data being stored in a distributed way into both the first non-volatile memory block and the second non-volatile memory block, wherein a first part of a word of the external data has been stored into the first non-volatile memory block, and a second part of the word of the external data has been stored into the second non-volatile memory block.

3. A non-volatile memory device as claimed in claim 1, wherein a first word of the external data has been stored into the first non-volatile memory block, and a second word of the external data has been stored into the second non-volatile memory block.

4. A non-volatile memory device as claimed in claim 1, wherein the first non-volatile memory block and the second non-volatile memory block are layout-wise interlaced.

5. A non-volatile memory device comprising:
   an input for providing external data to be stored on the non-volatile memory device; and
   a first non-volatile memory block and a second non-volatile memory block, the first non-volatile memory block and the second non-volatile memory block being provided on a single die, wherein the first non-volatile memory block and second non-volatile memory block are of a different type such that the first non-volatile memory block and the second non-volatile memory block require incompatible external attack techniques in order to retrieve data therefrom, the external data being stored in a distributed way into both the first non-volatile memory block and the second non-volatile memory block, wherein the first non-volatile memory block is a poly fuse memory and the second non-volatile memory block is a floating gate memory.

6. A non-volatile memory device as claimed in claim 5, wherein the poly fuse memory uses physically the same poly layer as the floating gate memory.

7. A non-volatile memory device comprising:
   an input for providing external data to be stored on the non-volatile memory device; and
   a first non-volatile memory block and a second non-volatile memory block, the first non-volatile memory block and the second non-volatile memory block being provided on a single die, wherein the first non-volatile memory block and second non-volatile memory block are of a different type such that the first non-volatile memory block and the second non-volatile memory block require incompatible external attack techniques in order to retrieve data there from, the external data being stored in a distributed way into both the first non-volatile memory block and the second non-volatile memory block, wherein bit lines of at least one of the first non-volatile memory block and the second non-volatile memory block have been scrambled.

8. A non-volatile memory device comprising:
   an input for providing external data to be stored on the non-volatile memory device; and
   a first non-volatile memory block and a second non-volatile memory block, the first non-volatile memory block and the second non-volatile memory block being provided on a single die, wherein the first non-volatile memory block and second non-volatile memory block are of a different type such that the first non-volatile memory block and the second non-volatile memory block require incompatible external attack techniques in order to retrieve data there from, the external data being stored in a distributed way into both the first non-volatile memory block and the second non-volatile memory block, wherein the non-volatile memory further comprises:
   a third non-volatile memory block, the third non-volatile memory block being provided on the same single die as the first non-volatile memory block and the second non-volatile memory block, wherein the third non-volatile memory block is of a different type than the first non-volatile memory block and second non-volatile memory block such that the first non-volatile memory block, the second non-volatile memory blocks, and the third non-volatile memory block require incompatible external attack techniques in order to retrieve data there from, the external data being stored in a distributed way into the first non-volatile memory block, the second non-volatile memory block, and the third non-volatile memory block.

9. A method of protecting data in a non-volatile memory device, the method comprising:

providing external data to be stored on the non-volatile memory device, the non-volatile memory device having a first non-volatile memory block and a second non-volatile memory block, the first non-volatile memory block and the second non-volatile memory block being provided on a single die, wherein the first non-volatile memory block and second non-volatile memory block are of a different type such that the first non-volatile memory block and the second non-volatile memory block require incompatible external attack techniques in order to retrieve data there from;

storing the external data in a distributed way into both the first non-volatile memory block and the second non-volatile memory block and retrieving from both in order to discern a set of data representing the external data distributed therein.

\* \* \* \* \*